(12) United States Patent
Rocznik (10) Patent No.: US 8,836,349 B2
(45) Date of Patent: Sep. 16, 2014

(54) CAPACITIVE SENSOR

(75) Inventor: Marko Rocznik, Cupertino, CA (US)

(73) Assignee: Robert Bosch GmbH, Stuttgart, DE (US)

( * ) Notice: Subject to any disclaimer, the term of this patent is extended or adjusted under 35 U.S.C. 154(b) by 206 days.

(21) Appl. No.: 13/586,632

(22) Filed: Aug. 15, 2012

(65) Prior Publication Data

US 2014/0049273 A1 Feb. 20, 2014

(51) Int. Cl.
*G01R 27/26* (2006.01)
*G01L 19/12* (2006.01)
*G01D 5/24* (2006.01)

(52) U.S. Cl.
CPC ............ *G01R 27/2605* (2013.01); *G01L 19/12* (2013.01); *G01D 5/24* (2013.01); *G01R 27/26* (2013.01)
USPC ........................................................ 324/679

(58) Field of Classification Search
USPC .............. 324/600, 676–684, 704–713, 76.11, 324/76.41, 76.52, 76.77, 647, 656
See application file for complete search history.

(56) References Cited

U.S. PATENT DOCUMENTS

| | | | |
|---|---|---|---|
| 3,289,074 A | 11/1966 | Jones | |
| 4,153,873 A | 5/1979 | Grindheim | |
| 4,250,452 A | 2/1981 | Gray et al. | |
| 4,800,755 A | 1/1989 | Fathauer et al. | |
| 4,987,782 A | 1/1991 | Shkedi et al. | |
| 5,750,903 A * | 5/1998 | Ryhanen .................... | 73/861.48 |
| 7,180,306 B2 | 2/2007 | Stanley et al. | |
| 7,356,423 B2 | 4/2008 | Nehrig | |
| 7,469,580 B2 | 12/2008 | Suzuki et al. | |
| 7,641,618 B2 | 1/2010 | Noda et al. | |
| 2005/0071114 A1* | 3/2005 | Nehrig .......................... | 702/127 |
| 2007/0194895 A1 | 8/2007 | Apostolopoulos et al. | |
| 2008/0168834 A1 | 7/2008 | Suzuki et al. | |

FOREIGN PATENT DOCUMENTS

FR 2576690 A1 8/1986
GB 2025623 A 1/1980

OTHER PUBLICATIONS

International Search Report and Written Opinion corresponding to PCT Application No. PCT/US2013/055051, mailed Dec. 10, 2013 (10 pages).

* cited by examiner

*Primary Examiner* — Melissa Koval
*Assistant Examiner* — Trung Nguyen
(74) *Attorney, Agent, or Firm* — Maginot, Moore & Beck (57) ABSTRACT

A sensor includes a variable capacitor, a fixed capacitor, an inductor, a switch that electrically connects the variable capacitor with the inductor or the fixed capacitor with the inductor, an oscillator that generates a periodic signal, and a controller connected to the switch, the oscillator, and the inductor. The controller operates the switch, identifies a frequency of a first oscillation of the variable capacitor and the inductor based on the periodic signal from the oscillator, identifies a frequency of a second oscillation of the fixed capacitor and the inductor based on the periodic signal from the oscillator, and identifies a capacitance of the variable capacitor based on a ratio of the frequency of the first oscillation to the frequency of the second oscillation.

21 Claims, 5 Drawing Sheets

CAPACITIVE SENSOR

TECHNICAL FIELD

This disclosure relates generally to electronic sensors, and, more particularly, to sensors that generate an electrical signal with reference to a change in the capacitance of a variable capacitor.

BACKGROUND

A capacitive sensor includes a variable capacitor with a capacitance value that changes in response to external stimuli. One embodiment of a capacitive sensor is a pressure sensor in which a capacitance of a variable capacitor, which is also referred to as a transducer, changes with reference to a level of pressure that is applied to the transducer. For example, a microelectromechanical (MEM) transducer can include two or more electrically conductive plates arranged in parallel to one another and separated by an electrically insulating dielectric, which in an absolute pressure sensor is a vacuum, between the plates. The distance between the plates and the amount of dielectric, and corresponding capacitance of the transducer, changes as the level of pressure applied to the transducer increases and decreases. An analog or digital controller can identify the pressure applied to the transducer by measuring the capacitance of the transducer. Other forms of capacitive sensor include humidity sensors, position sensors, proximity sensors, material thickness sensors, and any device configured to use a variable capacitor for sensing applications.

Many devices and systems that employ capacitive sensors identify a level of capacitance in the variable capacitor and convert the capacitance level to a digital value for processing with digital logic devices. For example, existing capacitive sensors use a switched capacitor circuit to generate a voltage signal corresponding to the capacitance of the variable capacitor, and then generate a digital value corresponding to the voltage signal using an analog to digital converter (ADC). One drawback of using a switched-capacitor voltage detector circuit and ADC for identifying the capacitance of the variable capacitor is the cost and complexity of the analog switching circuitry and ADC.

Another sensor configuration that generates a digital output is a resonance sensor. In a variable frequency oscillator, an oscillator amplifier circuit is coupled to the variable capacitor and the resonance frequency of the oscillator changes as the capacitance of the variable capacitors changes. A digital frequency counter measures the oscillator signal frequency to identify a digital value corresponding to the capacitance of the transducer in the sensor. One or more digital logic devices, including microcontrollers, microprocessors, application specific integrated circuits (ASICs), field programmable gate arrays (FPGAs), and the like, perform additional processing with the digital value.

One drawback of using a resonance sensor is that the sensor requires a precise frequency reference to identify the frequency of the variable oscillator with appropriate accuracy. Precision clock sources, such as crystal oscillators, which are suitable for use with the resonance sensors, also add to the expense of the sensor. Additionally, the variable oscillator typically includes an inductive coil. The inductance of the inductive coil and the corresponding resonant frequency of the oscillator change in response to changes in the relative permeability of the inductive coil's surroundings. These changes to the inductance of the coil reduce the accuracy of the sensor. In light of the drawbacks with existing capacitive sensors, improved devices and methods for capacitive sensing would be beneficial.

SUMMARY

In one embodiment, a sensor has been developed. The sensor includes a variable capacitor, a fixed capacitor, an inductor, a switch configured to alternate between a first position that electrically connects the variable capacitor in a parallel electrical circuit with the inductor and a second position that electrically connects the fixed capacitor in a parallel electrical circuit with the inductor, an oscillator configured to generate a periodic signal, and a controller operatively connected to the switch, the oscillator, and the inductor. The controller is configured to operate the switch to alternate between the first position and the second position, identify a frequency of a first oscillation of the variable capacitor in the parallel electrical circuit with the inductor based on the periodic signal generated by the oscillator when the switch is in the first position, identify a frequency of a second oscillation of the fixed capacitor in the parallel electrical circuit with the inductor based on the periodic signal generated by the oscillator when the switch is in the second position, and identify a capacitance of the variable capacitor based on a ratio of the frequency of the first oscillation to the frequency of the second oscillation.

In another embodiment, a method for identifying a capacitance of a variable capacitor in a sensor has been developed. The method includes generating a periodic signal with an oscillator, connecting the variable capacitor to an inductor in a parallel electrical circuit with a switch in a first position, identifying a frequency of a first oscillation of the variable capacitor in the parallel electrical circuit with the inductor based on the periodic signal generated by the oscillator when the switch is in the first position, connecting a fixed capacitor to the inductor in a parallel electrical circuit with the switch in a second position, identifying a frequency of a second oscillation of the fixed capacitor in the parallel electrical circuit with the inductor based on the periodic signal generated by the oscillator when the switch is in the second position, and identifying a capacitance of the variable capacitor based on a ratio of the frequency of the first oscillation to the frequency of the second oscillation.

DETAILED DESCRIPTION

For the purposes of promoting an understanding of the principles of the embodiments described herein, reference is now be made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Figure 1A:
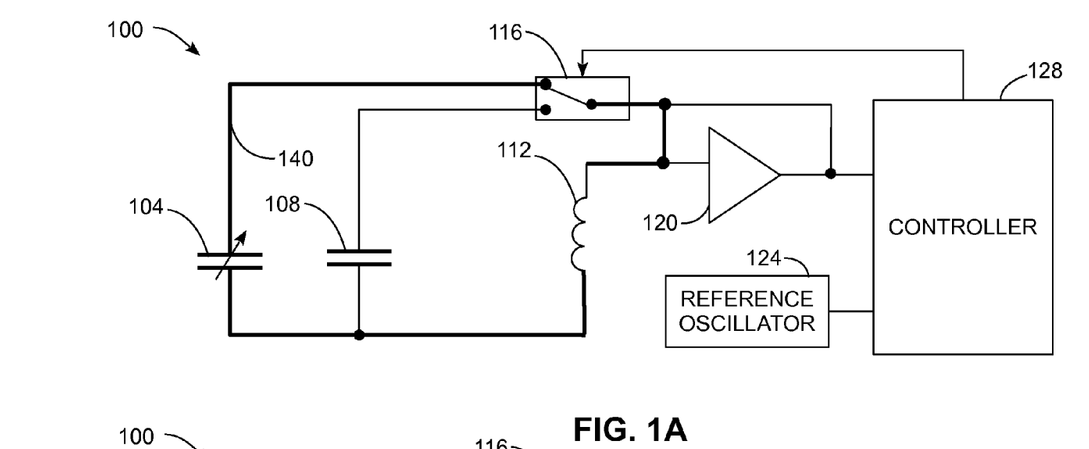
FIG. 1A is a schematic diagram of a capacitive sensor with a variable capacitor being electrically connected to an inductor.
Figure 1B:
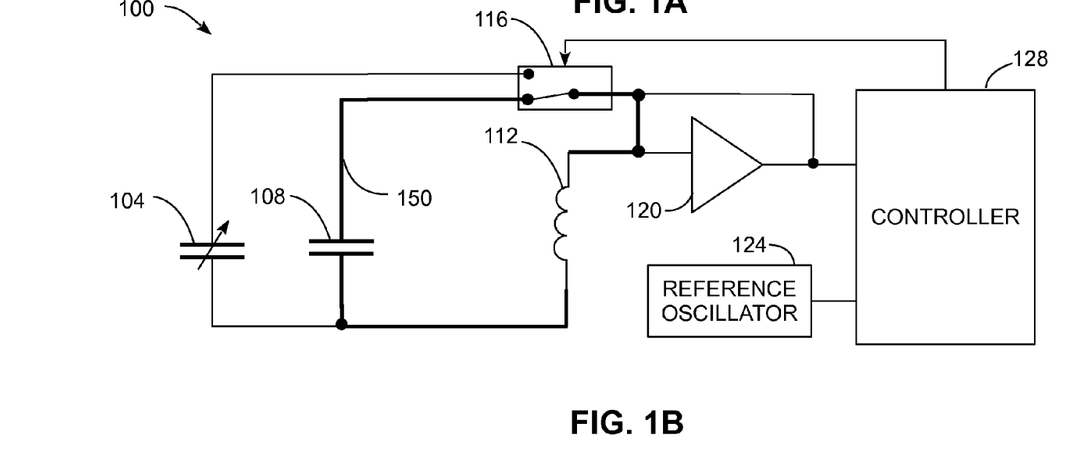
FIG. 1B is a schematic diagram of the capacitive sensor of FIG. 1A with a reference capacitor being electrically connected to the inductor.

FIG. 1A and FIG. 1B depict a sensor 100. The sensor 100 includes a variable capacitor 104, a fixed reference capacitor 108, inductor 112, switch 116, amplifier 120, reference oscillator 124, and controller 128. The variable capacitor 104 forms at least part of a sensor element in the sensor 100. That is to say, the capacitance of the variable capacitor 104 changes based on some physical phenomenon acting on the sensor 104. In one example, the variable capacitor 104 is a pressure transducer that exhibits changes in capacitance as a level of pressure applied to the variable capacitor 104 changes. The reference capacitor 108 is a fixed capacitor that is selected to have a predetermined capacitance that remains substantially constant during the operation of the sensor 100.

The variable capacitor 104 and reference capacitor 108 are selectively connected in parallel with the inductor 112 through the switch 116. FIG. 1A depicts the switch 116 in a first position to place the variable capacitor 104 in a parallel electrical circuit 140 with the inductor 112. FIG. 1B depicts the switch 116 in a second position to place the reference capacitor 108 into another parallel circuit 150 with the inductor 112. In the configuration of FIG. 1A, the inductor 112 and variable capacitor 104 form a first LC circuit 140, which is also referred to as a tank circuit. In the configuration of FIG. 1B, the inductor 112 and reference capacitor form a second LC circuit 150. As is known in the art, an electrical signal in an undamped LC circuit oscillates with a resonant frequency ω, which can be simply represented by the equation $$\omega = \frac{1}{\sqrt{LC}}.$$

In the previous equation, L is the inductance value of the inductor 112, and C is the capacitance value of the variable capacitor 104 in FIG. 1A or the reference capacitor 108 in FIG. 1B. During operation of the circuit, the value of the inductor L can change over time due to changes in the permeability of environment about the inductor. A varying permeability in the environment surrounding the inductor influences the inductance of the inductor. This is especially true if the inductor is formed from an open PCB coil where different materials can enter into the stray field. By way of example the sensor may have been calibrated in a vacuum (uR=1) but at a later time a ferromagnetic material may be positioned within the stray field of the inductor (e.g. a shielding material in a cell phone). This variation in the permeability in the environment surrounding the inductor would change the inductance. As described in more detail below, the relative difference in resonant frequencies between the LC circuits 140 and 150 can be used to identify the capacitance value of the variable capacitor 104.

The switch 116 places only one of the variable capacitor 104 or the reference capacitor 108 into the parallel circuit with the inductor 112 at any one time. In different embodiments, the switch 116 can be an electromechanical switch, such as a relay, or a solid-state switch, which includes no moving parts. Thus, the terms "first position" and "second position" describe two different electrical connections that the switch 116 establishes between the inductor 112 and the capacitors 104 and 108, and does not necessarily mean a physical position of the switch 116. In the sensor 100, the controller 128 is operatively connected to the switch 116 and can alternate the switch 116 between the first position and the second position.

In the sensor 100, the amplifier 120 generates a signal that drives the oscillating current in the LC oscillator circuit 140 in FIG. 1A and 150 in FIG. 1B. In one embodiment, the amplifier 120 is a transimpedance amplifier that acts as a current controlled voltage source that sequentially drives each of the LC oscillator circuits 140 and 150. The controller 128 also receives an output voltage signal from the amplifier 120. The controller 128 receives the oscillation signal and identifies the frequency of the oscillation based on an oscillating signal generated by the reference oscillator 124.

In one embodiment, the reference oscillator 124 is a resistor-capacitor (RC) oscillator that generates a reference oscillation signal with varying frequencies during operation. For example, the frequency of the reference signal generated by the RC oscillator 124 can change or "drift" during operation of the sensor 100. Additionally, the resistors in the reference oscillator generate low-frequency electrical noise, which is referred to as "flicker noise" or "1/f" noise, as well as a frequency independent or "white" Johnson-Nyquist noise. A typical RC oscillator is, however, more cost effective to incorporate with the sensor 100 than more precise oscillators, such as crystal oscillators. For example, the RC oscillator can be incorporated directly into the controller 128 as part of an integrated circuit.

Consequently, previously known options where to either accept the reduced accuracy resulting from noise in low-precision reference oscillators, such as the RC oscillator 124, or accept the increased cost of higher-precision oscillators, such as crystal oscillators, to provide a sensor with an acceptable accuracy. The sensor 100, however, compensates for both frequency drift and a significant portion of the noise in the RC oscillator 124 to maintain accuracy during operation.

While the reference oscillator 124 is an RC oscillator in the sensor 100, other oscillators, including LC oscillators that are integrated on-chip with the controller 128, ring oscillators, microelectromechanical systems (MEMS) oscillators, phased lock loops (PLLs) that are locked to external clock sources, and crystal oscillators, are used in alternative sensor embodiments.

In the sensor 100, the controller 128 is a digital logic device such as a microcontroller, microprocessor, application specific integrated circuit (ASIC), field programmable gate array (FPGA) or any other appropriate digital logic device. As described in more detail below, various components in the sensor 100 including, but not limited to, the inductor 112, the switch 116, amplifier 120, and the reference oscillator 124 can optionally be incorporated with the controller 128 into a single integrated circuit, can be implemented as discrete components, or can be partially or completely integrated with a sensor device. The controller 128 optionally includes an internal memory or be operatively connected to an external memory device. In the sensor 100, the memory can be used to store program instructions and other data if desired. For example, in one embodiment, the memory stores data corresponding to coefficients of calibration equations that are used for sensor calibration. In some embodiments, the controller 128 executes the programmed instructions that are stored in the memory to identify the capacitance of the variable capacitor 104 and optionally generate an output of the sensor 100 associated with the identified capacitance.

The controller 128 includes a frequency counter and digital logic that operate the switch 116 and identify the frequencies of the oscillations in the circuits 140 and 150. The frequency counter uses the oscillation signal from the reference oscillator 124 as a reference to identify the frequencies of the oscillations in the circuits 140 and 150. The controller 128 in this embodiment is also configured to identify the capacitance of the variable capacitor 104 with reference to the identified oscillation frequencies and a predetermined capacitance value of the reference capacitor 108.

The controller 128 also generates a digital value corresponding to a physical phenomenon that affects the sensor 100 associated with the identified capacitance of the variable capacitor 104. For example, in a pressure sensor configuration, the controller 128 identifies the level of pressure that is applied to the variable capacitor 104 that is associated with the identified capacitance of the variable capacitor 104. The controller 128 in different embodiments generates a digital representation of either or both of the capacitance of the variable capacitor 104 and the identified pressure level for use with additional digital processing devices (not shown).

Figure 2A:
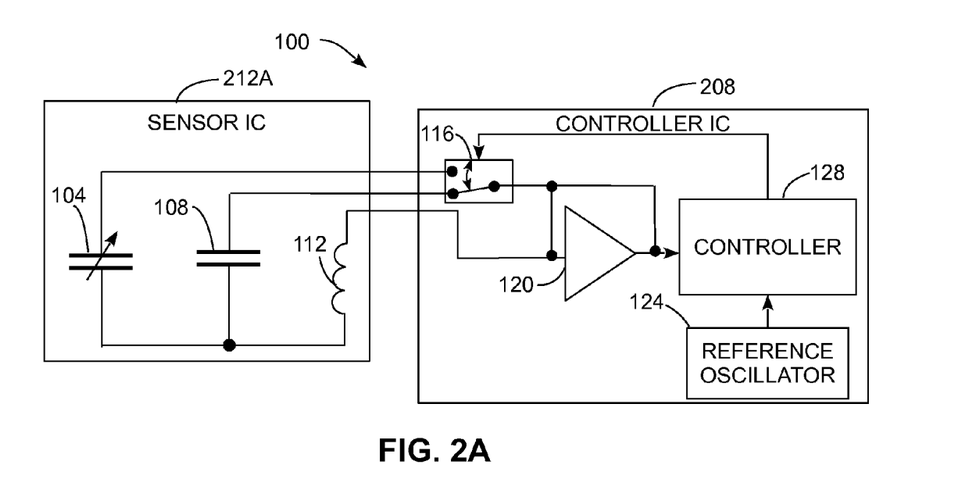
FIG. 2A is a first exemplary configuration of the sensor depicted in FIG. 1A and FIG. 1B including a variable capacitor, reference capacitor, and inductor in a single integrated sensor device.

FIG. 2A-FIG. 2F depict different embodiments of circuit configurations including the components described above with reference to FIG. 1A and FIG. 1B. FIG. 2A depicts one configuration of the sensor 100. In FIG. 2A, the variable capacitor 104, reference capacitor 108, and the inductor 112 are formed on a silicon die 212A, also referred to as a chip or integrated circuit. In one embodiment, the on-chip coil is a bond wire coil formed on a package of the chip, where multiple bond pads are provided and the coil is formed from bond wires. Another embodiment for the coil is a spiral formed from inductive material that is located above a thick isolator on the silicon die. In FIG. 2A, another integrated circuit 208 includes the switch 116, amplifier 120, reference oscillator 124, and controller 128. The integrated circuits 212A and 208 are electrically connected to form the sensor 100.

Figure 2B:
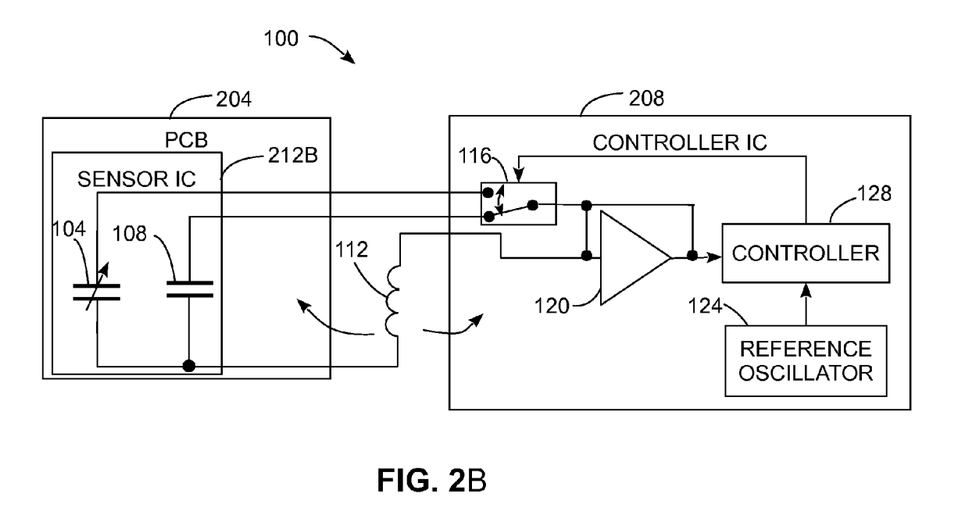
FIG. 2B is a second exemplary configuration of the sensor depicted in FIG. 1A and FIG. 1B including a variable capacitor and reference capacitor in a single integrated sensor device and an inductor separately located or alternatively formed on the PCB, attached to the PCB, or integrated with a digital controller.

FIG. 2B depicts a configuration in which sensor die 212B incorporates the variable capacitor 104 and reference capacitor 108. In FIG. 2B, the inductor 112 is shown located apart from the PCB 204, the controller IC 208, and the sensor IC 212B. In other embodiments, the inductor 112 is formed on a carrier substrate, such as printed circuit board (PCB) layer 204, that is electrically connected to the sensor IC 212B, or integrated with the controller IC 208. When formed on the PCB 204, the inductor 112 in some embodiments is formed as an etched planar coil of conductive material, such as aluminum or copper, on the surface placed between layers of the PCB 204. In another configuration, a discrete inductor, such as a coil of wire wrapped around a ferrite core, is affixed to the PCB 204. While FIG. 2B depicts a PCB 204, other carriers including ceramic packages, lead frames, and any other suitable carrier can be used in the sensor 100.

Figure 2C:
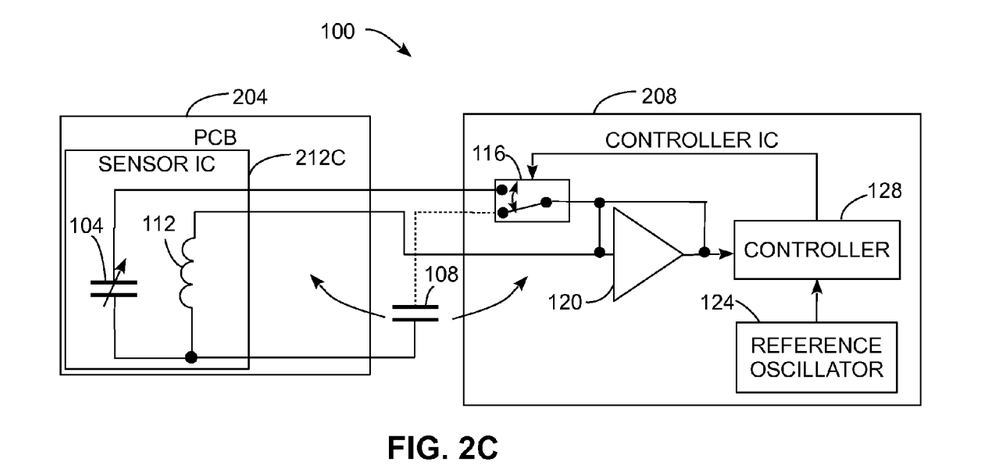
FIG. 2C is a third exemplary configuration of the sensor depicted in FIG. 1A and FIG. 1B including a variable capacitor and inductor in a single integrated sensor device and a reference capacitor separately located or alternatively formed on the PCB, attached to the PCB, or integrated with a digital controller.

FIG. 2C depicts an embodiment in which sensor integrated circuit 212C incorporates the variable capacitor 104 and the inductor 112. In FIG. 2C, the reference capacitor 108 is shown located separately from the PCB 204, the IC controller 208, and the sensor IC 212C. In other embodiments, the reference capacitor is formed on a carrier that is electrically connected to the sensor IC 212B, such as PCB 204, or integrated with the controller IC 208. When formed on the PCB 204, the reference capacitor in some embodiments is formed as two or more conductive plates that are separated by one or more layers of an electrically insulating material in the PCB 204, which act as dielectric for the reference capacitor 108. In another configuration, a discrete capacitor, such as a ceramic or electrolytic capacitor, is affixed to the PCB 204.

Figure 2D:
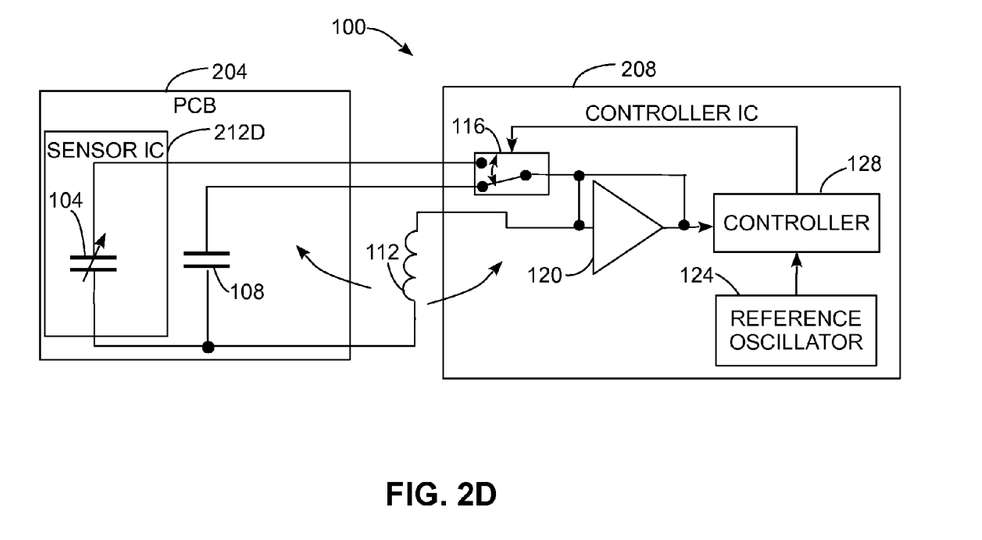
FIG. 2D is a fourth exemplary configuration of the sensor depicted in FIG. 1A and FIG. 1B including a variable capacitor in a sensor device and a reference capacitor formed on a PCB or attached to the PCB with an inductor separately located or alternatively formed on the PCB, attached to the PCB, or integrated with a digital controller.

FIG. 2D depicts an embodiment in which sensor integrated circuit 212D incorporates only the variable capacitor 104, and the reference capacitor 108 is incorporated with the carrier PCB 204 as described above with reference to FIG. 2C. In FIG. 2D, the inductor 112 can be incorporated with the PCB 204 or integrated with the controller integrated circuit 208 as described above with reference to FIG. 2B.

Figure 2E:
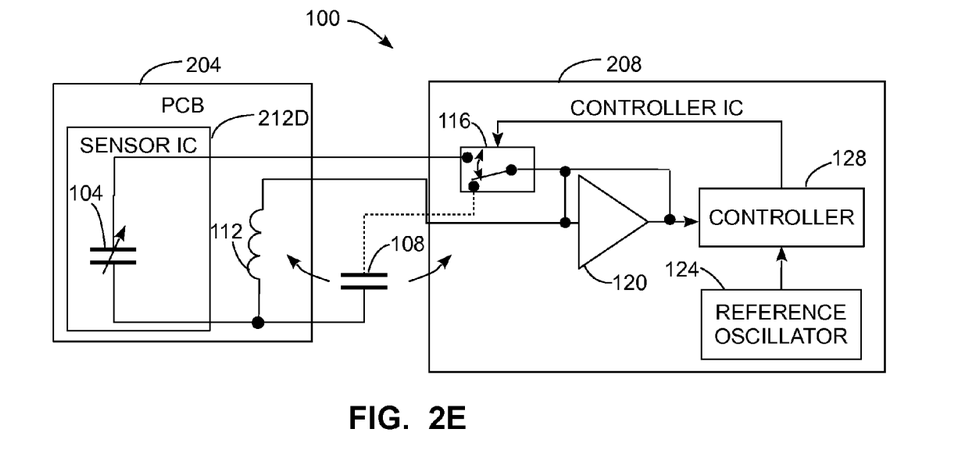
FIG. 2E is a fifth exemplary configuration of the sensor depicted in FIG. 1A and FIG. 1B including a variable capacitor in a sensor device and an inductor formed on a PCB, attached to the PCB, or integrated with a carrier package of the sensor, and with a reference capacitor separately located or alternatively formed on the PCB, attached to the PCB, or integrated with a digital controller.

FIG. 2E depicts another configuration in which sensor integrated circuit 212D incorporates only the variable capacitor 104, and the inductor 112 is incorporated with the carrier PCB 204 as described above with reference to FIG. 2B. In FIG. 2E, the reference capacitor 108 is shown located separately from the PCB 204, the IC controller 208, and the sensor IC 212C. In other embodiments, the reference capacitor is incorporated with the PCB 204 or integrated with the controller integrated circuit 208 as described above with reference to FIG. 2C.

Figure 2F:
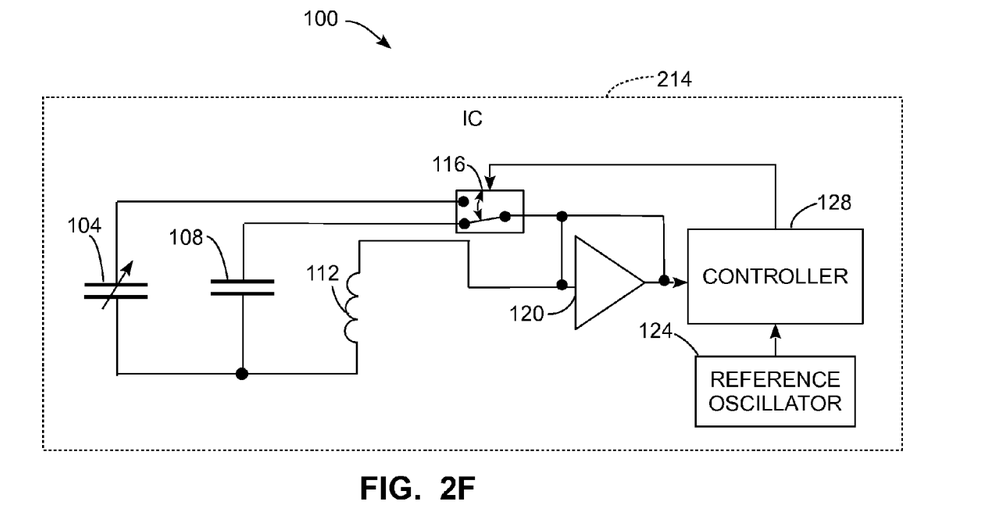
FIG. 2F is a sixth exemplary configuration of the sensor depicted in FIG. 1A and FIG. 1B including a sensor device and a controller that are formed in a single integrated device.

FIG. 2F depicts another embodiment of the sensor 100. In FIG. 2F, a single integrated circuit 214 incorporates the components of both the sensor 212 and controller 208 integrated circuits described above. For example, the integrated circuit 214 incorporates the variable capacitor 104, reference capacitor 108, inductor 112, switch 116, amplifier 120, reference oscillator 124 and controller 128.

The sensor configurations depicted in FIG. 2A-FIG. 2F are illustrative examples of different component configurations of the capacitive sensor 100. The configurations of FIG. 2A-FIG. 2F are not, however, an exhaustive list of all configurations for the sensor 100. Instead, the sensor 100 can include any suitable combination of discrete and integrated circuit components that function as described above with reference to FIG. 1.

Figure 3:
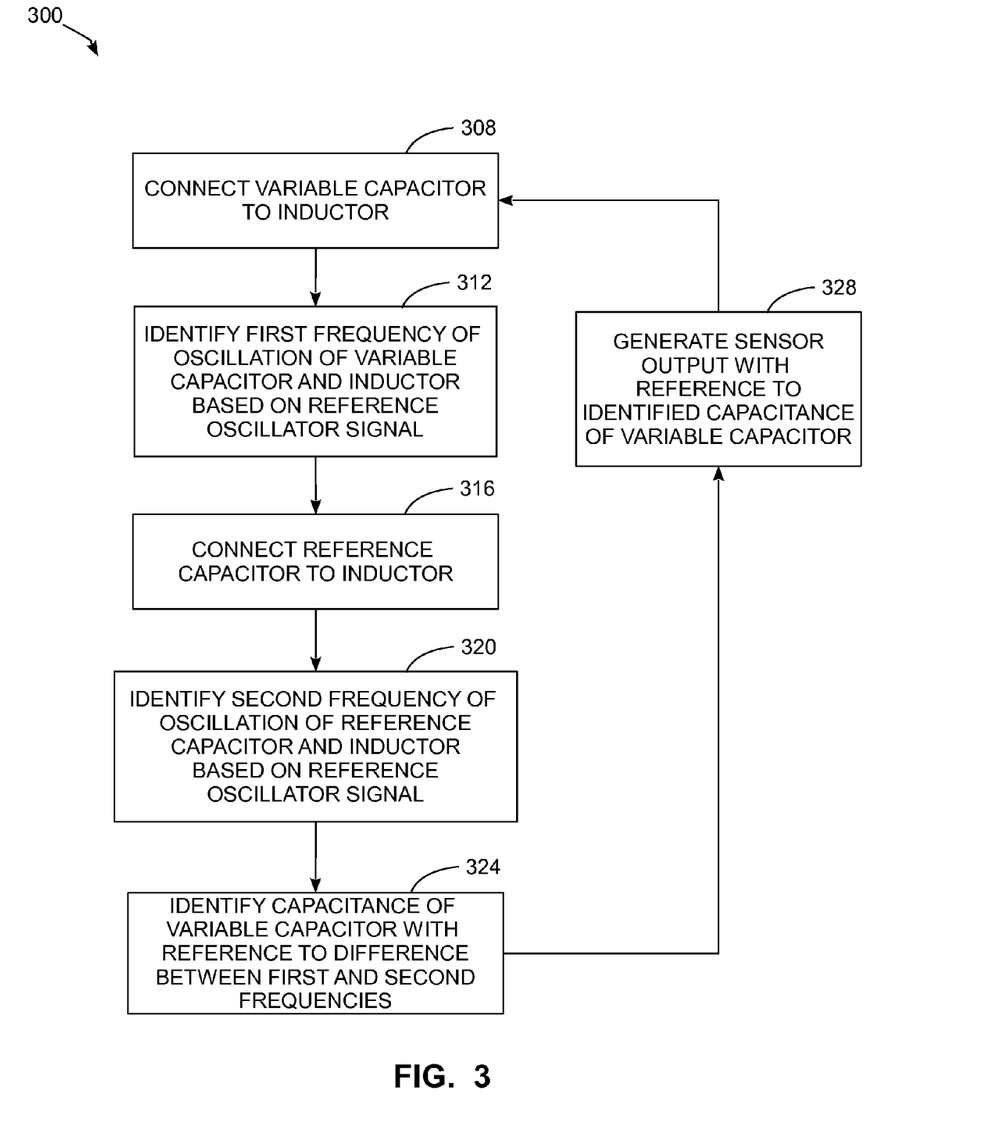
FIG. 3 is a block diagram of a process for operating a capacitive sensor.

FIG. 3 depicts a process 300 for operating a capacitive sensor. In the discussion below, a reference to the process 300 performing or doing some function or event refers to a controller configured to execute programmed instructions stored in a memory operatively connected to the controller to perform the function or event or to operate one or more components operatively connected to the controller to perform the function or event. Process 300 is described in conjunction with the sensor 100 as depicted in FIG. 1A and FIG. 1B for illustrative purposes.

During the process 300, the switch 116 sequentially moves between the first position depicted in FIG. 1A and the second position depicted in FIG. 1B at a predetermined frequency. In the sensor 100, the controller 128 generates switching signals for the switch 116 to alternate between the first position and the second position. In one embodiment, the output of the sensor signal is supplied to an output filter, and the switching frequency is higher than the upper corner frequency of the output filter. In one embodiment which is not not sensitive to noise in the output, the output filter is omitted. The controller 128 also alternates the switch 116 at a sufficiently low frequency to enable each of the oscillating circuits 140 and 150 to converge to a stable oscillation when the switch 116 is in the first position and the second position, respectively.

In the first position depicted in FIG. 1A, the switch 116 connects the variable capacitor 104 with the inductor 112 (block 308). The variable capacitor 104 and the inductor 112 form an LC circuit 140 that oscillates at a resonant frequency $\omega_v$. The transimpedance amplifier 120 drives the oscillating current in the LC circuit 140. The controller 128 identifies the resonant frequency $\omega_v$ (block 312) by measuring the oscillation signal using, for example, a frequency counter that uses a reference signal from the reference oscillator 124. In the processing described with reference to block 312, the capacitance value of the variable capacitor 104 is unknown since changes in pressure, humidity in the environment around the variable capacitor 104, or in another external factor produce changes in the capacitance of the variable capacitor 104. Additionally, the precise inductance value of the inductor 112 may be unknown, and the measured frequency $\omega_v$ may not precisely correspond to the actual oscillation frequency in the LC circuit 140 due to drift in the reference oscillator 124. Thus, in isolation, the measured frequency $\omega_v$ is insufficient to identify the capacitance of the variable capacitor 104 with great precision.

As the alternating operation of the switch 116 continues, the switch 116 moves to the second position depicted in FIG. 1B and connects the reference capacitor 108 with the inductor 112 (block 316). The reference capacitor 108 and the inductor 112 form the second LC circuit 150 that oscillates at a resonant frequency $\omega_r$, as the transimpedance amplifier 120 drives the LC oscillator circuit 150. The controller 128 measurers the oscillation signal using the frequency counter to identify the resonant frequency $\omega_r$ (block 320). The frequency counter can include, for example, a filter to reduce noise in the signals In the processing described with reference to block 320, the capacitance value of the reference capacitor 108 is known, but the precise inductance value of the inductor 112 may be unknown, and the measured frequency $\omega_r$ may not precisely correspond to the actual oscillation frequency in the LC circuit 150 due to noise in the reference oscillator 124.

While the absolute inductance value of the inductor 112 may not be known with precision, the relative inductance of the inductor 112 does not change significantly during the comparatively short period of time during the processing described with reference to blocks 308-320. Additionally, while the reference oscillator 124 is subject to errors due to noise, the reference oscillation frequency from the oscillator 124 does not change significantly during the processing described with reference to blocks 308-320. Consequently, while the absolute inductance value of the inductor 112 and the oscillation frequency of the reference oscillator 124 are subject to change over longer time periods, the relative inductance and oscillation frequency values do not vary substantially between the time when the controller 128 measures $\omega_v$ for the circuit 140 and $\omega_r$ for the circuit 150.

Process 300 continues as the controller 128 identifies the capacitance of the variable capacitor 104 based upon the predetermined capacitance value of the reference capacitor 108 and the difference between the measured frequencies $\omega_v$ and $\omega_r$ (block 324). The processing of block 324 can be illustrated mathematically using the simplified LC resonance equation $$\omega = \frac{1}{\sqrt{LC}}.$$

The frequency measured for the undamped LC circuit 140 is $$\omega_v = \frac{1}{\sqrt{LC_v}},$$

where L is the value of the inductor 112 and $C_v$ is the value of the variable capacitor 104. Solving for $C_v$ produces the equation $$C_v = \frac{1}{L\omega_v^2}.$$

In the undamped LC circuit 150, the resonant frequency is $$\omega_r = \frac{1}{\sqrt{LC_r}},$$

where L is also the inductance value of the inductor 112 and $C_r$ is the predetermined value of the reference capacitor 108. Since the fixed capacitance $C_r$ is a predetermined value, and a relative value for $\omega_r$ is identified based on the reference oscillator signal, the value of L is $$L = \frac{1}{C_f \omega_r^2}.$$

Substituting L into the equation for $C_v$ produces:

$$C_v = \frac{1}{\frac{\omega_v^2}{C_r \omega_r^2}} = C_r \left( \frac{\omega_r^2}{\omega_v^2} \right).$$

Thus, the capacitance $C_v$ of the variable capacitor 104 is identified based on the predetermined value $C_r$ of the reference capacitor and based on a ratio of the square of the resonant frequency $\omega_v$ of the loop including the inductor and the variable capacitor, and the square of the resonant frequency $\omega_r$ of the loop including the inductor and the reference capacitor. A precisely measured value of the inductor 112 is not needed to identify $C_v$, and even if the absolute values of $\omega_v$ and $\omega_r$ have some inaccuracies, the relative ratio between $\omega_v$ and $\omega_r$ remains unaffected by the noise in the reference oscillator 124.

During process 300, the controller 128 optionally generates digital sensor output data associated with the identified capacitance value of the variable capacitor 104 (block 328).

For example, if the sensor 100 is configured as a pressure sensor, the controller 128 uses the identified capacitance value to index into a lookup table or perform a predetermined function to identify a level of pressure that is exerted on the variable capacitor 104. The controller 128 outputs the pressure level data to one or more additional digital processing systems. In another embodiment, the controller 128 outputs a digital representation of the identified capacitance of the variable capacitor 104 without performing additional processing to generate separate sensor output data. In other embodiments, the controller 128 outputs an appropriate measurement, such as humidity level, based on the identified capacitance of the variable capacitor 104. Some embodiments generate an analog by using an digital to analog converter (DAC). The output signal can also be presented in any other state of the art control signals such as a current output (e.g. 4-20 mA), a pulse width modulated signal, a frequency signal, and the like.

Process 300 can return to the processing described above with reference to block 308 to identify the capacitance of the variable capacitor 104 in a continuous manner. In some embodiments, the controller 128 averages two or more capacitance values that are identified during consecutive iterations of the process 300 to reduce the effects of random noise or other errors in the measurement of the variable capacitor 104. For illustrative purposes, process 300 is described as identifying the oscillation frequency $\omega_v$ for the LC circuit 140 prior to the identification of the oscillation frequency $\omega_r$ for the LC circuit 150, but the identification of the oscillation frequencies $\omega_v$ and $\omega_r$ can be performed in any order.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A sensor comprising:
   a variable capacitor;
   a fixed capacitor;
   an inductor;
   a switch configured to alternate between a first position that electrically connects the variable capacitor in a parallel electrical circuit with the inductor and a second position that electrically connects the fixed capacitor in a parallel electrical circuit with the inductor;
   an oscillator configured to generate a periodic signal; and
   a controller operatively connected to the switch, the oscillator, and the inductor, the controller being configured to:
      operate the switch to alternate between the first position and the second position;
      identify a frequency of a first oscillation of the variable capacitor in the parallel electrical circuit with the inductor based on the periodic signal generated by the oscillator when the switch is in the first position;
      identify a frequency of a second oscillation of the fixed capacitor in the parallel electrical circuit with the inductor with reference to the periodic signal generated by the oscillator when the switch is in the second position; and
      identify a capacitance of the variable capacitor based on a ratio of the frequency of the first oscillation to the frequency of the second oscillation.

2. The sensor of claim 1, the variable capacitor being a humidity sensor element.

3. The sensor of claim 1, the variable capacitor being a pressure sensor element.

4. The sensor of claim 3, the controller being further configured to:
   identify a level of pressure applied to the variable capacitor based on the identified capacitance.

5. The sensor of claim 1 further comprising:
   an amplifier electrically connected to the inductor and configured to drive the first oscillation when the switch is in the first position and to drive the second oscillation when the switch is in the second position; and
   the controller being electrically connected to an output of the amplifier to receive the first oscillation and the second oscillation.

6. The sensor of claim 5, the controller and the amplifier being incorporated into an integrated circuit.

7. The sensor of claim 1 wherein the oscillator is one of a resistor-capacitor (RC) oscillator, a ring oscillator, a microelectromechanical systems (MEMS) oscillator, an inductor-capacitor (LC) oscillator that is integrated with the controller, and a phase locked loop (PLL) that is locked to a clock source that is external to the controller.

8. The sensor of claim 7, the controller being further configured to:
   operate the switch to alternate between the first position and the second position at a frequency that is greater than an output bandwidth of the sensor.

9. The sensor of claim 1, the controller and the reference oscillator being incorporated into an integrated circuit.

10. The sensor of claim 1 wherein the controller, the oscillator, and the inductor are incorporated into an integrated circuit.

11. The sensor of claim 1 wherein the variable capacitor and the fixed capacitor are mounted to a carrier; and
   the inductor is formed from a planar electrical conductor in the carrier.

12. The sensor of claim 11, the carrier being a printed circuit board (PCB).

13. The sensor of claim 1 wherein the variable capacitor and the fixed capacitor are incorporated in an integrated circuit.

14. The sensor of claim 13 wherein the inductor is incorporated into the integrated circuit.

15. A method of identifying a capacitance of a variable capacitor comprising:
   generating a periodic signal with an oscillator;
   connecting the variable capacitor to an inductor in a parallel electrical circuit with a switch in a first position;
   identifying a frequency of a first oscillation of the variable capacitor in the parallel electrical circuit with the inductor based on the periodic signal generated by the oscillator when the switch is in the first position;
   connecting a fixed capacitor to the inductor in a parallel electrical circuit with the switch in a second position;
   identifying a frequency of a second oscillation of the fixed capacitor in the parallel electrical circuit with the inductor based on the periodic signal generated by the oscillator when the switch is in the second position; and
   identifying a capacitance of the variable capacitor based on a ratio of the frequency of the first oscillation to the frequency of the second oscillation.

16. The method of claim 15 further comprising:
   changing the capacitance of the variable capacitor in response to a change in a pressure applied to the variable capacitor.

17. The method of claim 16 further comprising:
identifying a level of pressure applied to the variable capacitor based on the identified capacitance.

18. The method of claim 15 further comprising:
changing the capacitance of the variable capacitor in response to a change in a level of humidity applied to the variable capacitor.

19. The method of claim 15 further comprising:
driving the first oscillation with an amplifier; and
driving the second oscillation to generate with the amplifier.

20. The method of claim 15 further comprising:
generating the periodic signal with one of a resistor-capacitor (RC) oscillator, a ring oscillator, a microelectromechanical systems (MEMS) oscillator, an inductor-capacitor (LC) oscillator that is integrated with the controller, and a phase locked loop (PLL) that is locked to a clock source that is external to the controller.

21. The method of claim 20 further comprising:
operating the switch to alternate between the first position and the second position at a frequency that is greater than an output bandwidth of the sensor.

* * * * *